United States Patent
Yamamoto

(10) Patent No.: US 6,864,925 B2
(45) Date of Patent: Mar. 8, 2005

(54) TELEVISION TUNER HAVING LESS DISTORTION

(75) Inventor: Masaki Yamamoto, Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 489 days.

(21) Appl. No.: 10/017,433

(22) Filed: Dec. 14, 2001

(65) Prior Publication Data

US 2002/0075414 A1 Jun. 20, 2002

(30) Foreign Application Priority Data

Dec. 14, 2000 (JP) .................................... 2000-384917

(51) Int. Cl.⁷ .............................. H04N 5/50; H04N 5/44
(52) U.S. Cl. .................. 348/731; 348/725; 348/730; 455/178.1; 455/191.3
(58) Field of Search .................. 348/731, 732, 348/733, 730, 705, 725, 723, 726, 729, 728; 455/178.1, 191.1, 197.3, 191.3, 180.4; 334/47, 14, 15

(56) References Cited

U.S. PATENT DOCUMENTS

| | | | | |
|---|---|---|---|---|
| 3,892,983 A | * | 7/1975 | Okada et al. ............... | 327/487 |
| 4,305,158 A | * | 12/1981 | Fujishima et al. ......... | 455/187.1 |
| 4,326,295 A | | 4/1982 | Matsumoto et al. | |
| 4,771,332 A | * | 9/1988 | Metoki ....................... | 348/731 |
| 6,583,826 B1 | * | 6/2003 | Sawamoto et al. .......... | 348/731 |
| 6,665,022 B1 | * | 12/2003 | Yamamoto et al. ......... | 348/731 |

FOREIGN PATENT DOCUMENTS

| | | |
|---|---|---|
| DE | 2836288 | 3/1979 |
| DE | 3240491 | 7/1983 |
| DE | 4028572 | 3/1992 |
| DE | 19819544 | 11/1999 |
| EP | 0065013 | 11/1982 |
| EP | 0929153 | 7/1999 |
| JP | 09-093091 | 4/1997 |

* cited by examiner

Primary Examiner—Michael H. Lee
Assistant Examiner—Jean W. Désir
(74) Attorney, Agent, or Firm—Brinks Hofer Gilson & Lione

(57) ABSTRACT

A television tuner includes an input tuning circuit and an interstage tuning circuit. Each of the tuning circuits comprises a band-switching tuning circuit having a tuning inductor and a switching diode for switching an inductance of the inductor. A power supply voltage is applied to the anode of each of the switching diodes via each of anode-side feed resistors, the anode being DC-grounded via a current-conductor. A tuning frequency band of each of the input tuning circuit and the interstage tuning circuit is switched by applying a high or low level switching voltage to the cathode of each of the switching diodes via each of cathode-side feed resistors.

16 Claims, 2 Drawing Sheets

TELEVISION TUNER HAVING LESS DISTORTION

BACKGROUND OF THE INVENTION

1. Field of the Invention

The present invention relates to a television tuner for receiving a VHF band television signal.

2. Description of the Related Art

FIG. 3 shows a configuration of a conventional television tuner. An input tuning circuit 33 is coupled, via a filter 32 for removing undesired signals, to an input terminal 31 to which a VHF band television signal is inputted. The input tuning circuit 33 includes four inductors 33a to 33d connected in series and a varactor diode 33e connected in parallel with these inductors. Also, both ends of a switching diode 33f are connected in a high-frequency state between two nodes of these inductors 33a to 33d. The cathode of the switching diode 33f is DC-grounded (grounded for DC voltage) via a resistor 34 and is connected to a first terminal 36a of a band switching circuit 36 via a resistor 35. The anode thereof is connected to a second terminal 36b of the band switching circuit 36 via a resistor 37. The anode of the varactor diode 33e is grounded and tuning voltage is applied to the cathode thereof.

An output of the input tuning circuit 33 is provided to a field-effect transistor (dual gate FET) 38 constituting a high-frequency amplifier. A node of the cathode of the varactor diode 33e and the inductor 33d is coupled to a first gate which is an input terminal of the FET 38. A source of the FET 38 is grounded and a drain thereof is coupled to an interstage tuning circuit 39.

The interstage tuning circuit 39 is constituted by a double-tuned circuit. Provided on the primary side thereof are two inductors 39a and 39b connected in series, and the inductor 39a is connected to the drain of the FET 38. Also, provided on the secondary side are two inductors 39d and 39e connected in series via a DC cutting capacitor 39c, and the inductor 39d is coupled to a mixer (not shown). In addition, the inductors 39b and 39e are connected to a coupling inductor 39f, and the coupling inductor 39f is grounded in a high-frequency state via a DC cutting capacitor 39g. The power supply voltage B is applied to a node of the coupling inductor 39f and the DC cutting capacitor 39g via a resistor 40. Consequently, voltage is applied to the drain of the FET 38 via the resistor 40, the inductors 39a and 39b, and so forth.

A node of the inductors 39a and 39b on the primary side is connected to the anode of a switching diode 39i via a DC cutting capacitor 39h, and a node of the DC cutting capacitor 39c and the inductor 39e on the secondary side is connected to the anode of a switching diode 39k via a DC cutting capacitor 39j. The anode of the switching diode 39i is connected to the second terminal 36b via a resistor 41, and the anode of the switching diode 39k is connected to the second terminal 36b via a resistor 42. The cathodes of the switching diodes 39i and 39k are grounded via a resistor 43 and a DC cutting capacitor 44, and are connected to the first terminal 36a via a resistor 45.

In addition, provided on the primary side is a varactor diode 39m connected in parallel to the inductors 39a and 39b and so forth. Provided on the secondary side is a varactor diode 39n connected in parallel to the inductors 39d and 39e and so forth. The anodes of the varactor diodes 39m and 39n are grounded and tuning voltage is applied to their cathodes.

The band switching circuit 36 is for switching the input tuning circuit 33 and the interstage tuning circuit 39 so that they can tune into high and low VHF frequency band. When each of the tuning circuits 33 and 39 is tuned to the low band, high-level voltage (e.g., power supply voltage) is outputted to the first terminal 36a. When each of the tuning circuits 33 and 39 is tuned to the high band, high-level voltage is outputted to the second terminal 36b. The band switching circuit 36 is controlled by a channel-selection signal from channel-selection means (not shown).

In the configuration described above, when each of the tuning circuits 33 and 39 is tuned to the low band, voltage is applied to the cathodes of the switching diodes 33f, 39i, and 39k, but voltage is not applied to the anodes, so that the switching diodes 33f, 39i, and 39k are effectively deactivated (or turned off) by being in an unbiased state. Accordingly, every inductor becomes effective and a tuning frequency band becomes low. Further, the resistor 34 and the resistor 43 provide a current path for the activated switching diode 33f and the activated (i.e. turned on) switching diodes 39i and 39k, respectively, when each of the tuning circuits 33 and 39 is tuned to the high band. As a result, two inductors 33b and 33c are essentially removed from the input tuning circuit 33 by being effectively shorted by the activated switching diode 33f and the associated capacitor. Similarly, the effective inductance supplied by the four inductors 39b, 39a, 39d, and 39e and the coupling inductor 39f when the switching diodes 39i and 39k are turned on deviates from the inductance supplied when the switching diodes 39i and 39k are turned off in the interstage tuning circuit 39. Accordingly, the tuning frequency band of each of the tuning circuits 33 and 39 becomes high. In addition to altering the frequency using the switching diodes, the tuning frequency of each band may be changed by tuning voltage applied to each of the varactor diodes 33e, 39m, and 39n.

In the configuration described above, distortion to an input signal may be generated when each of the switching diodes is turned off. That is, as shown in FIG. 4, each of the switching diodes is turned off by the voltage applied from the band switching circuit to each of the cathodes. However, voltage is not applied to each of the anodes at this time, and thus the anodes are left floating. Consequently, a reverse voltage is not applied to both ends of each of the switching diodes and the switching diodes are in an unbiased state. Thus, when a high level television signal is inputted, the switching diodes are rectified, generating distortion.

In addition, while resistor 43 of the interstage tuning circuit is provided to supply a current path when the switching diodes are turned on, current remains flowing through this resistor even when the switching diodes are turned off, increasing current consumption. Further, eight resistors are used in the conventional DC circuit for turning on or off each of the switching diodes. It would be beneficial to reduce the relatively large number of resistors and other components in the conventional DC circuit.

SUMMARY OF THE INVENTION

Accordingly, it is an object of the present invention to provide a television tuner in which the number of resistors used in a DC circuit for turning on or off a switching diode is reduced, and a reverse voltage is applied between the anode and cathode of the switching diode when the switching diode is turned off, so that distortion is not generated even when a large amplitude television signal is inputted, and current consumption is reduced.

To this end, a television tuner according to one embodiment comprises: an input tuning circuit coupled to an input terminal; a high-frequency amplifier supplied with an output of the input tuning circuit; and an interstage tuning circuit supplied with an output of the high-frequency amplifier. Each of the input tuning circuit and the interstage tuning circuit comprises a band-switching tuning circuit having a tuning inductor and a switching diode to switch an inductance of the inductor. A power supply voltage is applied to the anode of each of the switching diodes via each of anode-side feed resistors, the anode being DC-grounded via current-conductor. A tuning frequency band of each of the input tuning circuit and the interstage tuning circuit is switched by applying a high or low level switching voltage to the cathode of each of the switching diodes via each of cathode-side feed resistors.

With these features, each of the switching diodes is completely turned off by applying a reverse voltage to both ends thereof, so that distortion is not generated even when a large amplitude television signal is inputted. Also, since voltage is applied to the cathode of the switching diode of the interstage tuning circuit by only the cathode-side feed resistor, inefficient current consumption can be prevented. Further, the number of feed resistors for applying voltage to the switching diodes and the number of DC cutting capacitors can be reduced. In addition, only one output terminal of a band switching circuit is required, which contributes to cost cutting.

Preferably, the high-frequency amplifier includes an amplifying element, the current-conductor that DC-grounds the anode of the switching diode of the input tuning circuit is a first resistor, and the anode of the switching diode of the interstage tuning circuit is connected to an operating voltage applying terminal of the amplifying element such that the current-conductor is the amplifying element.

Accordingly, a voltage at the anode of the switching diode in the interstage tuning circuit becomes low by current conducted to the amplifying element, so that a reverse voltage can be applied easily to both ends of the switching diode.

The television tuner may further comprise a band switching circuit which generates the switching voltage, wherein the band switching circuit is provided with a switching transistor which can be switched on/off, the emitter of the switching transistor is grounded and the power supply voltage is applied to the collector via a second resistor, so that each of the cathodes is connected to the collector of the switching transistor via each of the cathode-side feed resistors.

With this arrangement, current of each of the switching diodes can be conducted to the switching transistor by turning on the switching transistor.

The switching transistor and the second resistor may be integrated in the band switching circuit.

Accordingly, a switching voltage can be easily obtained.

DESCRIPTION OF THE PREFERRED EMBODIMENTS

Figure 1:
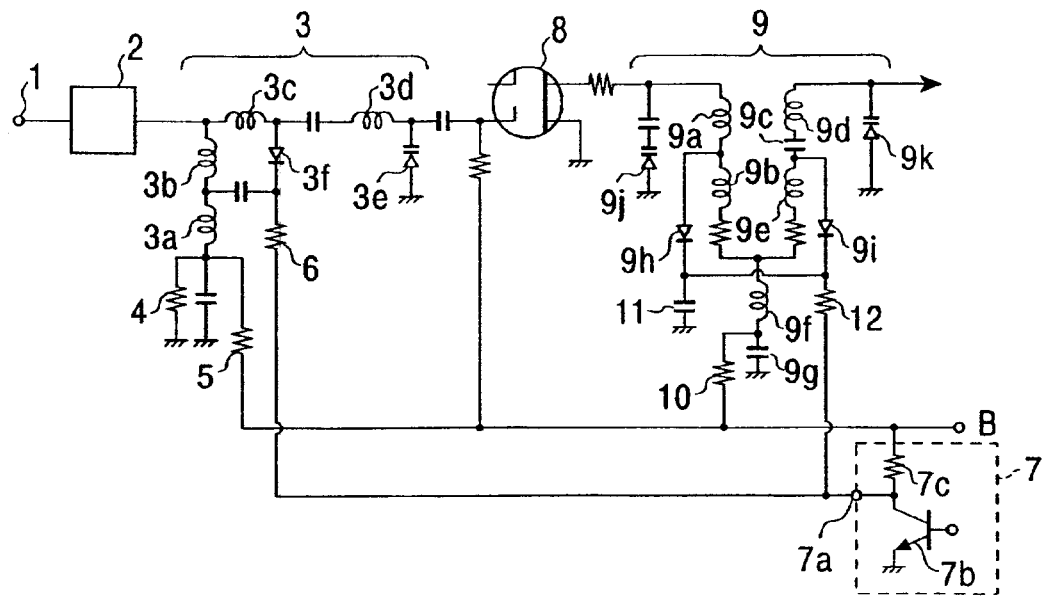
FIG. 1 is a circuit diagram showing a configuration of a television tuner of the present invention.

FIG. 1 shows a configuration of a television tuner of the present invention. An input tuning circuit 3 is coupled, via a filter 2 for removing undesired signals, to an input terminal 1 to which a high and low VHF band television signal is inputted. The input tuning circuit 3 includes four tuning inductors 3a to 3d connected in series and a tuning varactor diode 3e connected in parallel with these inductors. Also, both ends of a switching diode 3f are connected in a high-frequency state between two nodes of these inductors 3a to 3d. The anode of the switching diode 3f is DC-grounded (grounded for DC voltage) via a first resistor 4 functioning as a current-conductor and is connected to a power terminal B via a first anode-side feed resistor 5. The cathode thereof is connected to an output terminal 7a of a band switching circuit 7 via a first cathode-side feed resistor 6. The anode of the varactor diode 3e is grounded and tuning voltage is applied to the cathode thereof (not shown).

An output of the input tuning circuit 3 is provided to an FET (dual gate FET) 8. The FET 8 is an amplifying element constituting a high-frequency amplifier and which functions as a current-conductor. A node of the cathode of the varactor diode 3e and the inductor 3d is coupled to a first gate which is an input terminal of the FET 8. A source of the FET 8 is grounded and a drain which is an operating voltage applying terminal is coupled to an interstage tuning circuit 9.

The interstage tuning circuit 9 is constituted by a double-tuned circuit. Provided on the primary side thereof are two tuning inductors 9a and 9b connected in series, and the inductor 9a is connected to the drain of the FET 8. Also, provided on the secondary side are two tuning inductors 9d and 9e connected in series, with a DC cutting capacitor 9c therebetween, and the inductor 9d is coupled to a mixer (not shown). In addition, the inductors 9b and 9e are connected to a coupling inductor 9f, and the coupling inductor 9f is grounded in a high-frequency state via a DC cutting capacitor 9g. The power supply voltage B is applied to a node of the coupling inductor 9f and the DC cutting capacitor 9g via a second anode-side feed resistor 10. Consequently, voltage is applied to the drain of the FET 8 via the second anode-side feed resistor 10, the inductors 9b and 9a, and so forth.

The anode of a switching diode 9h is directly connected to a node of the inductors 9a and 9b on the primary side, and the anode of a switching diode 9i is directly connected to a node of the DC cutting capacitor 9c and the inductor 9e on the secondary side. The cathodes of the switching diodes 9h and 9i are grounded via a DC cutting capacitor 11, while connected to the output terminal 7a of the band switching circuit 7 via a second cathode-side feed resistor 12.

In addition, provided on the primary side is a tuning varactor diode 9j connected in parallel to the inductors 9a and 9b and so forth. Provided on the secondary side is a tuning varactor diode 9k connected in parallel to the inductors 9d and 9e and so forth. The anodes of the varactor diodes 9j and 9k are grounded, and tuning voltage is applied to their cathodes (not shown).

The band switching circuit 7 is an integrated circuit and is for switching the input tuning circuit 3 and the interstage tuning circuit 9 so that they can tune into each high and low VHF frequency band. The band switching circuit 7 includes a switching transistor 7b and a second resistor 7c. The emitter of the switching transistor 7b is grounded and the collector thereof is connected to the output terminal 7a. Also, power supply voltage is applied to the collector via the second resistor 7c. The switching transistor 7b is on/off controlled by a channel-selection signal from channel-selection means (not shown). When each of the tuning circuits 3 and 9 is tuned to the low band, the switching transistor 7b is turned off so that the output terminal 7a is at a high level, and when each of the tuning circuits 3 and 9 is tuned to the high band, the switching transistor 7b is turned on so that the output terminal 7a is at a low level. Although the switching transistor illustrated is that of a bipolar junction transistor, other semiconductor switches may also be used, including three terminal devices such as FETs and thyristors.

Figure 2:
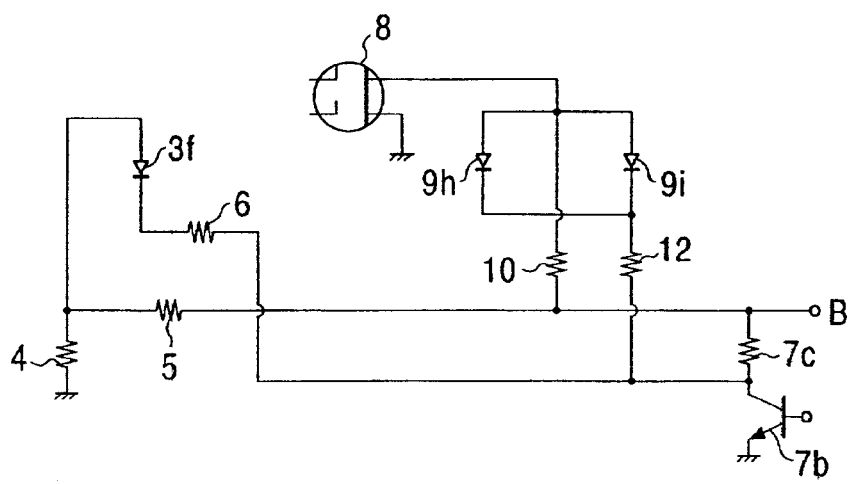
FIG. 2 is a DC circuit diagram with switching diodes of the television tuner of the present invention.
Figure 3:
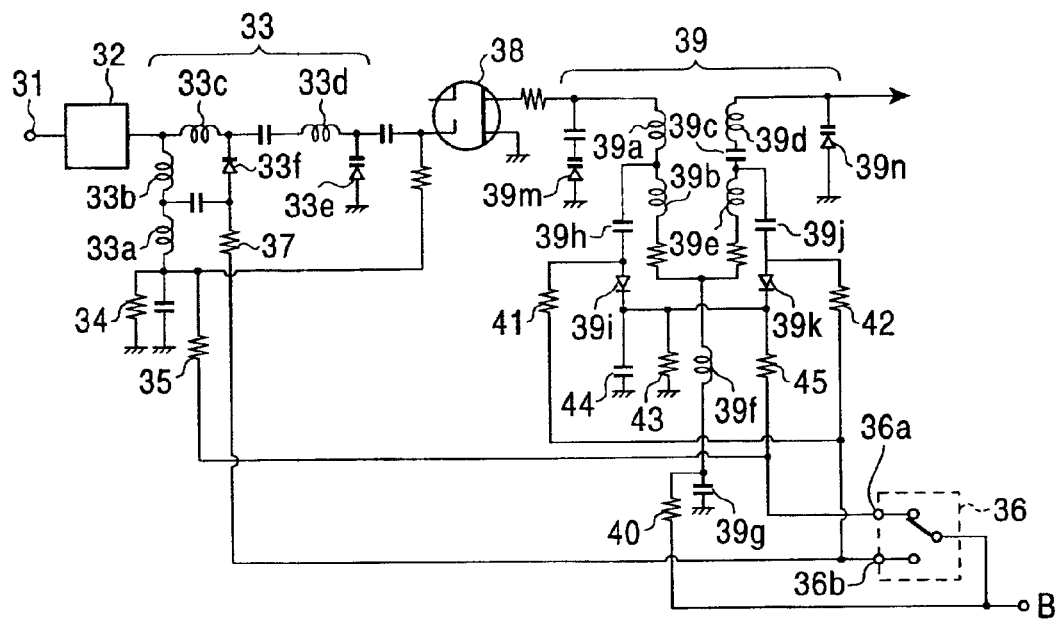
FIG. 3 is a circuit diagram showing a configuration of a conventional television tuner.
Figure 4:
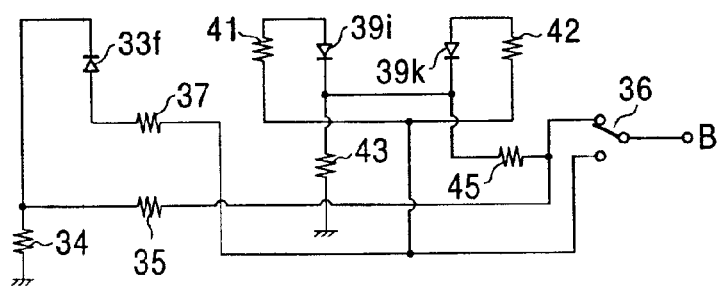
FIG. 4 is a DC circuit diagram with switching diodes of the conventional television tuner.

FIG. 2 shows a DC circuit with each of the switching diodes of the above-described configuration. Hereinafter, an operation of the configuration is described referring to FIG. 2. When each of the tuning circuits 3 and 9 is tuned to the low band, the switching transistor 7b of the band switching circuit 7 is turned off, so that voltage is applied from the output terminal 7a to the cathodes of the switching diodes 3f, 9h, and 9i. Also, since the anode of the switching diode 3f of the input tuning circuit 3 is grounded via the first resistor 4, a reverse voltage is applied to both ends of the first switching diode 3f, and thus the switching diode 3f is completely turned off. On the other hand, since the anodes of the switching diodes 9h and 9i of the interstage tuning circuit 9 are connected to the drain of the FET 8 and drain current is applied to the FET 8 via the second anode-side feed resistor 10, the anode voltage of each of the switching diodes 9h and 9i is low. Accordingly, a reverse voltage is applied to both ends of each of the switching diodes 9h and 9i, and thus the switching diodes 9h and 9i are completely turned off. In this case, since voltage is applied to the cathodes of the switching diodes 9h and 9i of the interstage tuning circuit 9 by only the second cathode-side feed resistor 12, inefficient current consumption can be prevented.

Consequently, every inductor becomes effective and a tuning frequency band of each of the tuning circuits 3 and 9 becomes low.

When each of the tuning circuits 3 and 9 is tuned to the high band, the switching transistor 7b is turned on. Voltage is applied to the anode of the switching diode 3f of the input tuning circuit 3 via the first anode-side feed resistor 5 and also voltage is applied to the anodes of the switching diodes 9h and 9i of the interstage tuning circuit 9 via the second anode-side feed resistor 10. Accordingly, each of the switching diodes 3f, 9h, and 9i receives a current via the switching transistor 7b and is turned on. As a result, two inductors 3b and 3c deviate from the input tuning circuit 3 and four inductors 9b, 9a, 9d, and 9e and the coupling inductor 9f deviate from the interstage tuning circuit 9. Accordingly, the tuning frequency band of each of the tuning circuits 3 and 9 becomes high.

As described above, each of the switching diodes 3f, 9h, and 9i can be turned on or turned off by five resistors including four feed resistors 5, 6, 10, and 12, and the first resistor 4. Also, the number of DC cutting capacitors is reduced.

In addition, the tuning frequency may be changed by tuning voltage applied to each of the varactor diodes 3e, 9j, and 9k.

What is claimed is:

1. A television tuner comprising:
   an input tuning circuit coupled to an input terminal;
   a high-frequency amplifier supplied with an output of said input tuning circuit; and
   an interstage tuning circuit supplied with an output of said high-frequency amplifier,
   each of said input tuning circuit and said interstage tuning circuit including a band-switching tuning circuit having a tuning inductor and a switching diode configured to switch an inductance of the inductor,
   wherein a power supply voltage is applied to an anode of each of the switching diodes via each of anode-side feed resistors, the anode being DC-grounded via a current-conductor, and
   wherein a tuning frequency band of each of said input tuning circuit and said interstage tuning circuit is switched by applying one of a high and low level switching voltage to a cathode of each of the switching diodes via each of cathode-side feed resistors.

2. The television tuner according to claim 1, wherein said high-frequency amplifier includes an amplifying element, the current-conductor for DC-grounding the anode of the switching diode of said input tuning circuit is a first resistor, and the anode of the switching diode of said interstage tuning circuit is connected to an operating voltage applying terminal of the amplifying element such that the current-conductor that DC-grounds the anode of the switching diode of said interstage tuning circuit is the amplifying element.

3. The television tuner according to claim 1, further comprising a band switching circuit which generates the switching voltage, wherein said band switching circuit is provided with a switching transistor which can be switched on/off, an emitter of the switching transistor is grounded and the power supply voltage is applied to a collector of the switching transistor via a second resistor, and each of the cathodes of the switching diodes is connected to the collector of the switching transistor via each of the cathode-side feed resistors.

4. The television tuner according to claim 3, wherein the switching transistor and the second resistor are integrated in said band switching circuit.

5. A television tuner comprising:
   an input tuning circuit coupled to an input terminal, the input tuning circuit having a first inductance, a first switching diode that tunes the first inductance, a first anode resistor that supplies an anode of the first switching diode with a power supply voltage, and a first cathode resistor that supplies a switching voltage to a cathode of the first switching diode, a tuning frequency band of the input tuning circuit being switched by switching a voltage level of the switching voltage, the anode of the first switching diode being DC-grounded through a grounding resistor;
   an amplifier supplied with an output of the input tuning circuit; and
   an interstage tuning circuit supplied with an output of the amplifier, the interstage tuning circuit having a second inductance, a second switching diode that tunes the second inductance, a second anode resistor that supplies an anode of the second switching diode with the power supply voltage, and a second cathode resistor that supplies a switching voltage to a cathode of the second switching diode, a tuning frequency band of the interstage tuning circuit being switched by switching the voltage level of the switching voltage, the anode of the second switching diode being DC-grounded.

6. The television tuner according to claim 5, wherein the anode of the switching diode of the interstage tuning circuit is connected with the amplifying element.

7. The television tuner according to claim 5, further comprising a band switching circuit which generates the switching voltage, the band switching circuit having a semiconductor switch with at least three terminals, a first terminal of the semiconductor switch being directly grounded, the power supply voltage being applied to a second terminal of the semiconductor switch via a terminal resistor, and the first and second cathodes connected to the second terminal of the semiconductor switch via the respective cathode resistor.

8. The television tuner according to claim 7, wherein the semiconductor switch comprises a bipolar junction transistor and the first and second terminals are the emitter and collector, respectively.

9. The television tuner according to claim 7, wherein the semiconductor switch and the terminal resistor are integrated.

10. A television tuner comprising:

an input terminal adapted to accept a television signal;

a semiconductor switch having two switch states;

an input tuning circuit coupled to the input terminal, such that the television signal is applied to the input tuning circuit, the input tuning circuit having a first inductance and a first circuit element that alters a value of the first inductance in accordance with state of the first circuit element;

an amplifier supplied with an output of the input tuning circuit; and an interstage tuning circuit supplied with an output of the amplifier, such that an amplified television signal is applied to the interstage tuning circuit, the interstage tuning circuit having a second inductance and a second circuit element that alters a value of the second inductance in accordance with a state of the second circuit element, wherein the first and second circuit elements are semiconductor devices, and the circuit elements are maintained in a conductive or a non-conductive state, depending on the state of the semiconductor switch, the conductive or non-conductive state being independent of amplitudes of the television signal and the amplified television signal.

11. The television tuner according to claim 10, each of the first and second inductances comprising inductors, the first and second inductances being altered by the first and second circuit elements by effectively bypassing at least one inductor in each of the first and second inductances.

12. The television tuner according to claim 11, wherein the semiconductor switch comprises a bipolar junction transistor and the first and second circuit elements each comprise a semiconductor diode.

13. The television tuner according to claim 12, wherein the semiconductor switch is contained within an integrated circuit.

14. The television tuner according to claim 10, wherein the circuit elements are diodes.

15. The television tuner according to claim 14, wherein the semiconductor switch supplies one of at least two voltages, said supplied voltage being applied between anodes and cathodes of the diodes, depending on the state of the switch.

16. The television tuner according to claim 15, wherein the voltage applied across the diodes is one of a forward bias and a reverse bias.

* * * * *